(12) United States Patent
Kenney et al.

(10) Patent No.: US 11,489,528 B1
(45) Date of Patent: Nov. 1, 2022

(54) APPARATUS, SYSTEM, AND METHOD FOR ACHIEVING ACCURATE INSERTION COUNTS ON REMOVABLE MODULES

(71) Applicant: Juniper Networks, Inc., Sunnyvale, CA (US)

(72) Inventors: John Kenney, Sunnyvale, CA (US); Bo Mi, Sunnyvale, CA (US); Ryan Holmes, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 17/512,682

(22) Filed: Oct. 28, 2021

(51) Int. Cl.
    *H03K 21/40*     (2006.01)
    *H01R 13/66*     (2006.01)
    *G01R 31/3185*     (2006.01)

(52) U.S. Cl.
    CPC ......... *H03K 21/40* (2013.01); *H01R 13/6675* (2013.01); *G01R 31/318527* (2013.01)

(58) Field of Classification Search
    CPC ...... H03K 21/38; H03K 21/40; H03K 21/403; H03K 21/406; H01R 13/667
    USPC ............................................... 377/28, 44, 54
    See application file for complete search history.

(56) References Cited

U.S. PATENT DOCUMENTS 5,179,670 A * 1/1993 Farmwald ........... G06F 13/4068
    710/104
6,219,798 B1 * 4/2001 Choi ...................... H03K 21/38
    713/502

* cited by examiner

*Primary Examiner* — Hai L Nguyen
(74) *Attorney, Agent, or Firm* — FisherBroyles, LLP

(57) ABSTRACT

A disclosed apparatus for accomplishing such a task may include (1) a circuit board incorporated into a module designed for insertion into slots of computing devices, (2) at least one conductive contact disposed on the circuit board, (3) a counter circuit disposed on the circuit board and communicatively coupled to the conductive contact, wherein the counter circuit comprises (A) a signal-change detector that detects signal changes as the module is inserted into one of the slots of the computing devices and (B) a counter device that maintains a dynamic count indicative of a number of times that the module has been inserted into one of the slots of the computing devices based at least in part on the signal changes, (4) a battery electrically coupled to the counter circuit, wherein the battery powers the counter device prior to the insertion. Various other apparatuses, systems, and methods are also disclosed.

20 Claims, 11 Drawing Sheets

APPARATUS, SYSTEM, AND METHOD FOR ACHIEVING ACCURATE INSERTION COUNTS ON REMOVABLE MODULES

BACKGROUND

Computing devices often undergo quality-control testing prior to shipment and/or delivery to retailers and/or customers. To perform this quality-control testing, a manufacturer may insert test modules into slots of computing devices (e.g., routers and/or switches) to ensure functionality and/or diagnose defects. Unfortunately, these test modules may have a limited lifespan and/or need replacement after a certain number of uses and/or insertions to ensure proper testing of the computing devices.

For example, a test module may include a circuit board with conductive edge fingers that mate and/or interface with a connector. In this example, the conductive edge fingers may wear and/or degrade to the point of no longer being reliable for testing purposes. To determine whether the test module has reached that point of wear and/or degradation, the test module may implement a counting mechanism intended to track the number of uses and/or insertions into slots of computing devices.

Unfortunately, conventional counting mechanisms may suffer from certain deficiencies that impair accuracy and/or precision in tracking the number of uses and/or insertions. For example, if the slot undergoing testing loses power for one reason or another, a conventional counting mechanism may increment the count representing the number of insertions erroneously once power returns to the slot. As a result, the testing module may appear to have been inserted more than it actually has been. In another example, if the test module is inserted without ever receiving power from the slot, the conventional counting mechanism may fail to increment the count representing the number of insertions. As a result, the testing module may appear to have been inserted less than it actually has been.

The instant disclosure, therefore, identifies and addresses a need for additional and improved apparatuses, systems, and methods for achieving and/or maintaining accurate insertion counts on removable modules.

SUMMARY

As will be described in greater detail below, the instant disclosure generally relates to apparatuses, systems, and methods for achieving and/or maintaining accurate insertion counts on removable modules. In one example, an apparatus for accomplishing such a task may include (1) a circuit board incorporated into a module designed for insertion into slots of computing devices, (2) at least one conductive contact disposed on the circuit board, (3) a counter circuit disposed on the circuit board and communicatively coupled to the conductive contact, wherein the counter circuit comprises (A) a signal-change detector that detects signal changes as the module is inserted into one of the slots of the computing devices and (B) a counter device that maintains a dynamic count indicative of a number of times that the module has been inserted into one of the slots of the computing devices since a first moment in time based at least in part on the signal changes, and (4) a battery electrically coupled to the counter circuit, wherein the battery powers the counter device prior to the insertion of the module into one of the slots of the computing devices.

Similarly, a system for accomplishing such a task may include (1) one or more network devices that include slots fitted to house optical modules, (2) a test module designed for insertion within the slots included on the network devices, wherein the network devices comprise (A) a circuit board that includes at least one conductive contact, (B) a counter circuit disposed on the circuit board and communicatively coupled to the conductive contact, wherein the counter circuit comprises (I) a signal-change detector that detects signal changes as the module is inserted into one of the slots of the computing devices and (II) a counter device that maintains a dynamic count indicative of a number of times that the module has been inserted into one of the slots of the computing devices since a first moment in time based at least in part on the signal changes, and (C) a battery electrically coupled to the counter circuit, wherein the battery powers the counter device prior to the insertion of the module into one of the slots of the computing devices.

A corresponding method may include (1) disposing at least one conductive contact on a circuit board, (2) disposing, on the circuit board, a counter circuit that comprises (A) a signal-change detector and (B) a counter device communicatively coupled to the signal-change detector, (3) electrically coupling a battery to the counter circuit disposed on the circuit board, and (4) incorporating the circuit board and the battery into a module designed for insertion into slots of computing devices such that (A) the signal-change detector detects signal changes as the module is inserted into one of the slots of the computing devices, (B) the counter device maintains a dynamic count indicative of a number of times that the module has been inserted into one of the slots of the computing devices since a first moment in time based at least in part on the signal changes, and (C) the battery powers the counter device prior to the insertion of the module into one of the slots of the computing devices.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
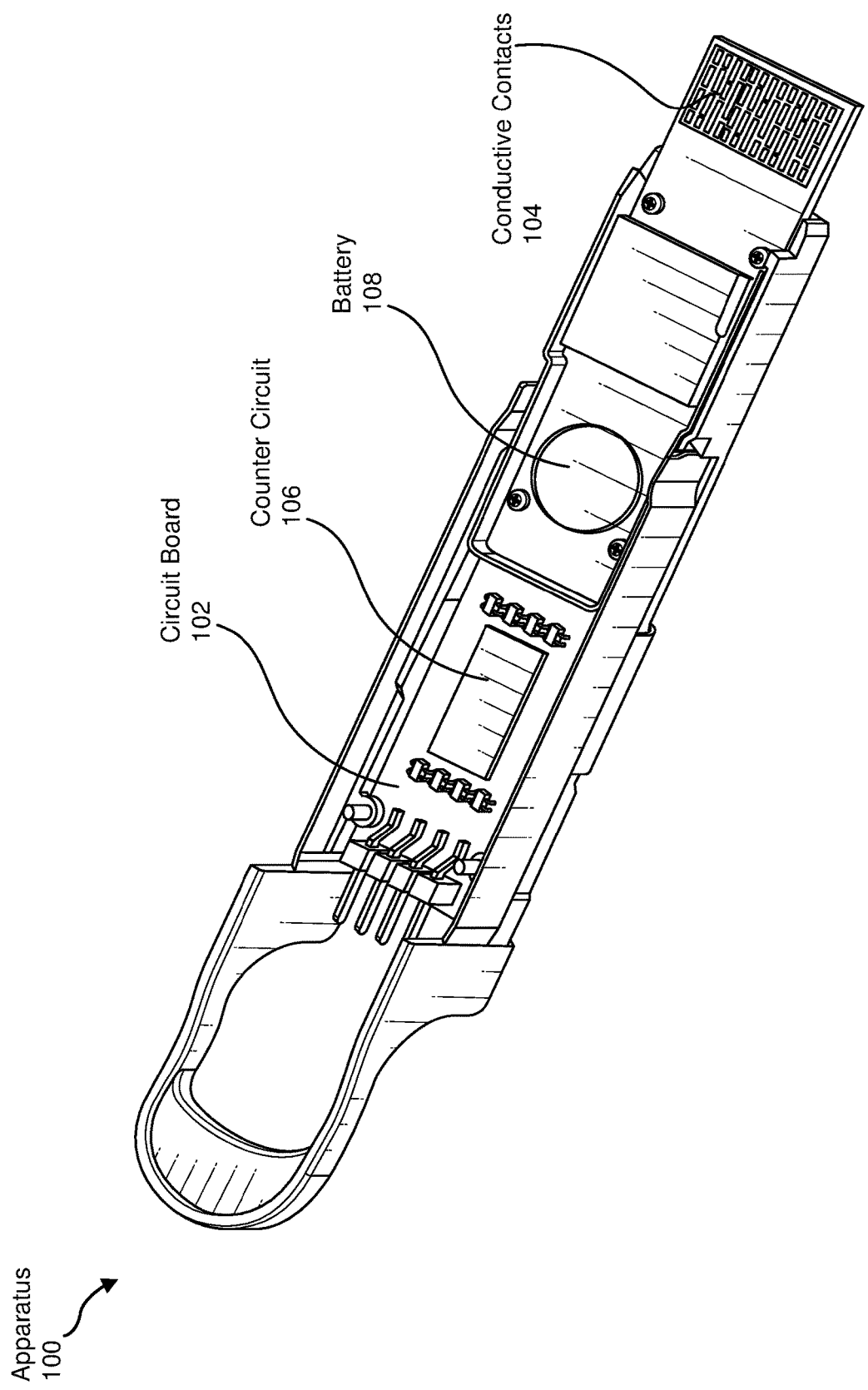
FIG. 1 is an illustration of an exemplary apparatus for achieving and/or maintaining accurate insertion counts on removable modules in accordance with one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for achieving accurate insertion counts on removable modules. As will be explained in greater detail below, embodiments of the instant disclosure may include and/or involve a counter circuit communicatively coupled to one or more conductive contacts disposed on a circuit board. In some examples, the counter circuit may maintain a dynamic count indicative of the number of times that a removable module has been inserted into a slot based at least in part on signal changes that result from insertion. Additionally or alternatively, embodiments of the instant disclosure may include and/or involve a battery electrically coupled to the counter circuit. In some examples, the battery may power the counter device prior to the insertion of the removable module into a slot.

In some examples, this configuration of counter circuit and battery may be implemented in a test module that is used to ensure functionality and/or diagnose defects in slots and/or corresponding computing devices. This configuration of counter circuit and battery may enable the test module to achieve and/or maintain an accurate insertion count despite power outages on the slots and/or computing devices undergoing functionality and/or diagnostic testing and/or despite insertions that occur without power being transferred from the slots and/or computing devices to the test module. As a result, this configuration of counter circuit and battery may enable the testing module to achieve and/or maintain an accurate insertion count that was previously unachievable with conventional insertion-count technologies.

The following will provide, with reference to FIGS. 1-10, detailed descriptions of exemplary components, apparatuses, systems, configurations, and/or implementations for achieving accurate insertion counts on removable modules. In addition, the discussion corresponding to FIG. 11 will provide detailed descriptions of an exemplary method for assembling and/or manufacturing apparatuses for achieving accurate insertion counts on removable modules.

FIG. 1 illustrates an exemplary apparatus 100 for achieving an accurate insertion count on a removable module. As illustrated in FIG. 1, exemplary apparatus 100 may include and/or represent a circuit board 102 incorporated into a module designed for insertion into slots of computing devices. In some examples, apparatus 100 may also include and/or represent conductive contacts 104 disposed on circuit board 102. In such examples, apparatus 100 may further include and/or represent a counter circuit 106 disposed on circuit board 102 and communicatively coupled to conductive contacts 104.

In one example, counter circuit 106 may include and/or represent a signal-change detector that detects signal changes as the module is inserted into one of the computing devices. In this example, counter circuit 106 may also include and/or represent a counter device that maintains a dynamic count indicative of the number of times that the module has been inserted into one of the slots of the computing devices since a first moment in time based at least in part on the signal changes. In one embodiment, the first moment in time may include and/or represent the creation and/or nascency of the module. In another embodiment, the first moment in time may include and/or represent the occurrence of an event that caused the dynamic count to reset.

Additionally or alternatively, apparatus 100 may include and/or represent a battery 108 electrically coupled to counter circuit 106. In some examples, battery 108 may power the counter device prior to the insertion of the module into the one of the slots of the computing device.

In some examples, circuit board 102 may include and/or contain a variety of materials. Some of these materials may conduct electricity. Other materials included in circuit board 102 may insulate the conductive materials from one another.

In some examples, circuit board 102 may include and/or incorporate various electrically conductive layers, planes, and/or traces. In one example, each electrically conductive layer, plane, and/or trace may include and/or represent conductive material that is etched during the fabrication phase to produce various conductive paths throughout circuit board 102. In this example, the etched conductive paths may be separated from and/or interconnected with one another as necessary to form one or more circuits that incorporate electrical components and/or electronics across circuit board 102. Examples of such electrically conductive materials include, without limitation, copper, aluminum, silver, gold, alloys of one or more of the same, combinations or variations of one or more of the same, and/or any other suitable materials.

In some examples, circuit board 102 may include and/or incorporate insulating material that facilitates mounting (e.g., mechanical support) and/or interconnection (e.g., electrical coupling) of electrical and/or electronic components. In one example, circuit board 102 may include and/or represent a Printed Circuit Board (PCB). Additionally or alternatively, circuit board 102 may include and/or represent a single-layer board or a multi-layer board.

As illustrated in FIG. 1, circuit board 102 may include and/or represent insulation material that electrically insulates certain electrically conductive layers from one another. In some examples, insulation material may be disposed, laid out, and/or applied as planes between the electrically conductive layers. In such examples, the insulation material may constitute and/or represent a dielectric substance that is a poor conductor of electricity and/or is polarized by an applied electric field.

Dielectric substances may be implemented as solids, liquids, and/or gases. Examples of dielectric substances include, without limitation, porcelains, glasses, plastics, industrial coatings, silicon, germanium, gallium arsenide, mica, metal oxides, silicon dioxides, sapphires, aluminum oxides, polymers, ceramics, variations or combinations of one or more of the same, and/or any other suitable dielectric materials.

Conductive contacts 104 each generally represent any type or form of conductive pad and/or lead. In one example, conductive contacts 104 may include and/or represent a set of edge fingers arranged and/or configured to mate and/or interface with finger leads of a connector incorporated within a slot of a computing device (e.g., a switch or router). In this example, conductive contacts 104 may carry and/or transmit electrical and/or communication signals between the module and the slot of the computing device.

Conductive contacts 104 may include and/or represent any type or form of electrically conductive material. Examples of such electrically conductive materials include, without limitation, copper, aluminum, silver, gold, alloys of one or more of the same, combinations or variations of one or more of the same, and/or any other suitable materials.

Counter circuit 106 may include and/or represent a single integrated circuit and/or a plurality of components that are communicatively coupled to one another on circuit board 102. In some examples, the signal-change detector in counter circuit 106 may include and/or represent a set-reset flip-flop with a set input that is communicatively coupled to one of the conductive contacts and a reset input that is communicatively coupled to another one of the conductive contacts. In one example, the counter device may include and/or represent a 4-bit counter capable of counting and/or storing a record of up to 16 insertions without power being transferred between from a slot to the module. After 16 insertions without power, the 4-bit counter may reset.

Battery 108 may include and/or represent any type or form of portable electric power source. In some examples, battery 108 may include and/or represent electrochemical cells that provide electric power to counter circuit 106 on the module. Examples of battery 108 include, without limitation, lithium-ion batteries, lithium-polymer batteries, primary lithium batteries, alkaline batteries, coin batteries, button cell batteries, rechargeable batteries, combinations or variations of one or more of the same, and/or any other suitable type of battery.

Figure 2:
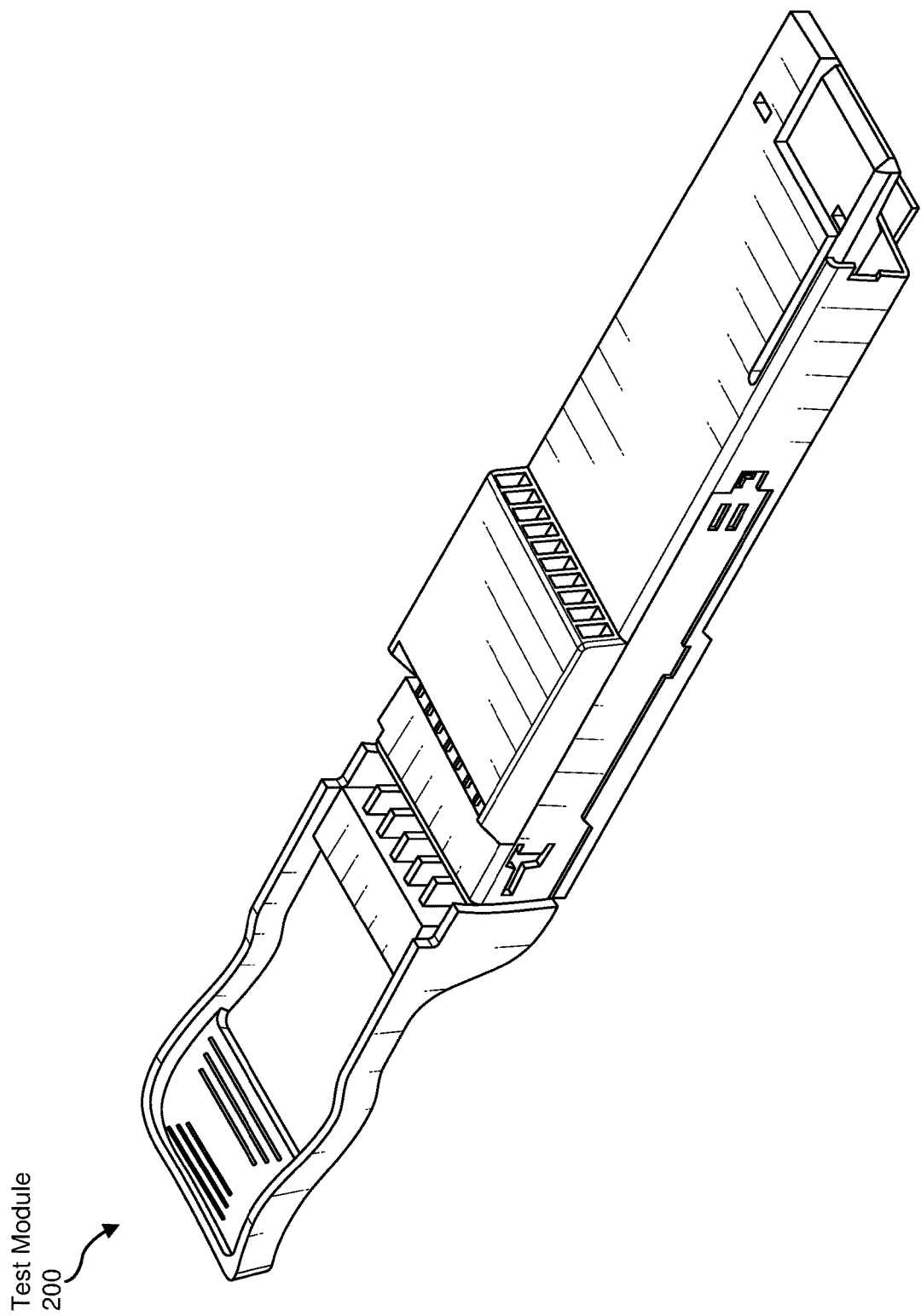
FIG. 2 is an illustration of an exemplary test module capable of achieving and/or maintaining accurate insertion counts in accordance with one or more embodiments of this disclosure.

FIG. 2 illustrates an exemplary test module 200 for achieving an accurate insertion count. In some examples, test module 200 may include and/or represent an implementation of exemplary apparatus 100 in FIG. 1. In such examples, test module 200 may be formatted to fit within slots designed to house optical modules and/or transceivers in network devices (e.g., routers and switches). Accordingly, test module 200 may include and/or represent circuit board 102, conductive contacts 104, counter circuit 106, and/or battery 108.

Figure 3:
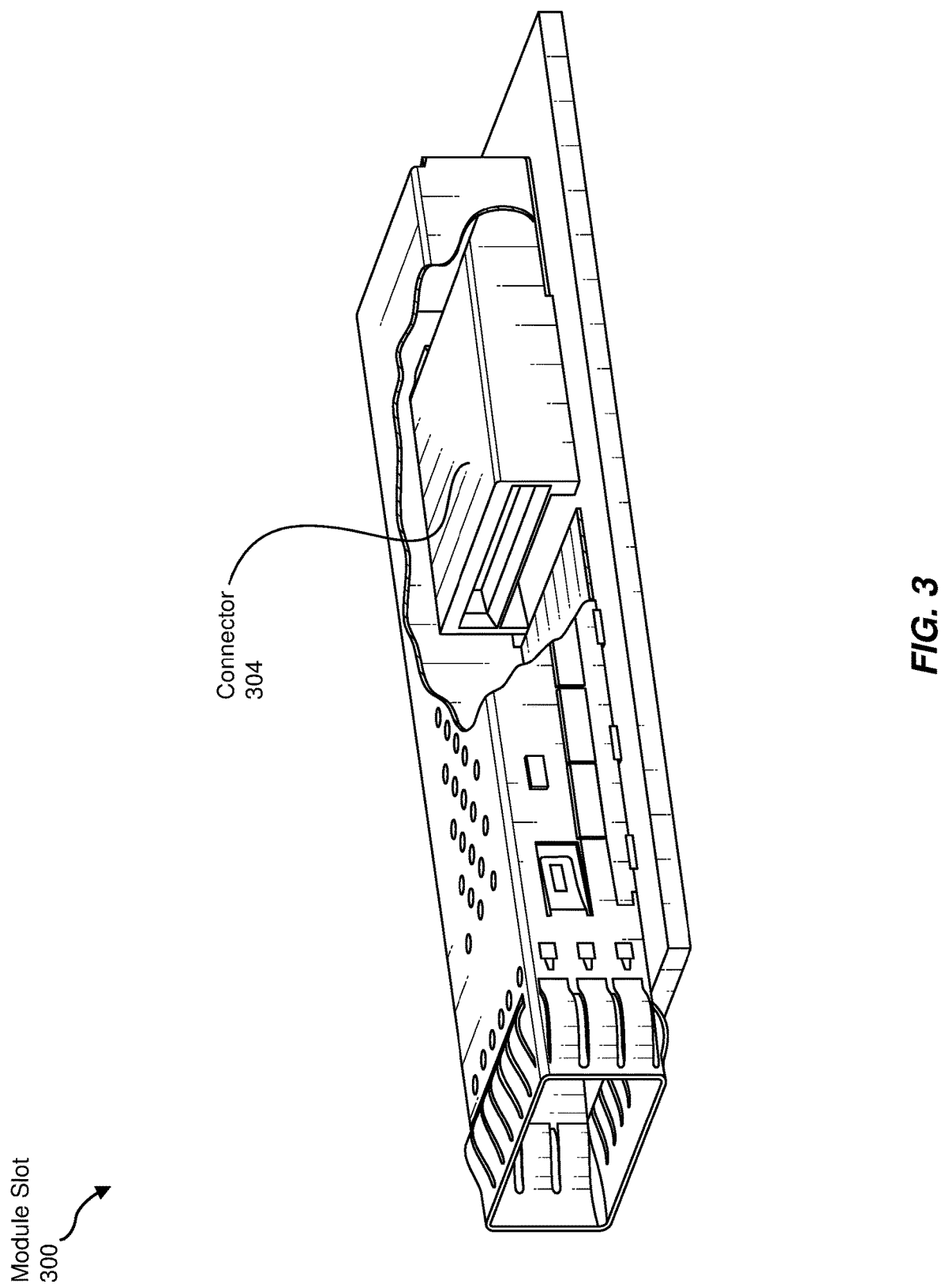
FIG. 3 is an illustration of an exemplary module slot fitted to house an optical module in a network device sin accordance with one or more embodiments of this disclosure.

FIG. 3 illustrates an exemplary module slot 300 of a computing device capable of undergoing testing via test module 200 in FIG. 2. In some examples, exemplary module slot 300 may be formatted to house, accept, and/or retain optical modules and/or transceivers in network devices (e.g., routers and switches). In such examples, module slot 300 may also be formatted to house, accept, and/or retain test module 200 while undergoing testing to ensure functionality and/or diagnose defects.

As illustrated in FIG. 3, module slot 300 may include and/or represent a connector 304 that facilitates mating and/or interfacing with test module 200. For example, connector 304 may include and/or represent finger leads that make physical and/or electrical contact with one or more of conductive contacts 104 of test module 200 as test module 200 is inserted into module slot 300. In this example, the finger leads may slide and/or glide across conductive contacts 104 to generate a signal indicative of insertion for test module 200.

Figure 4:
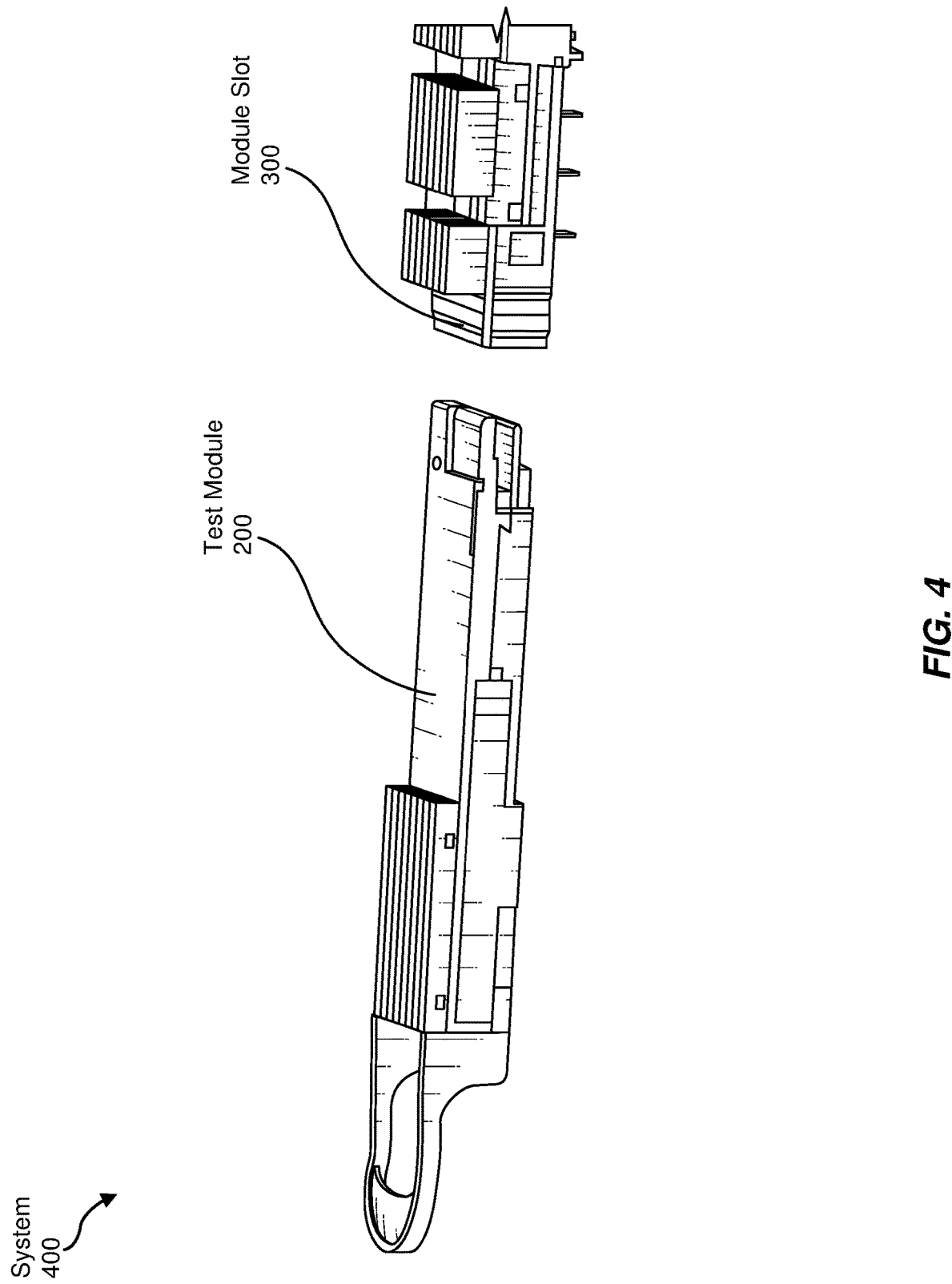
FIG. 4 is an illustration of an exemplary system for achieving and/or maintaining accurate insertion counts on removable modules in accordance with one or more embodiments of this disclosure.

FIG. 4 illustrates an exemplary system 400 that includes test module 200 being inserted into module slot 300 for testing and/or diagnostic purposes. In some examples, test module 200 may detect its insertion into module slot 300 via one or more signal changes that occur on conductive contacts 104. In such examples, counter circuit 106 may account for and/or record this insertion by incrementing a dynamic count indicative of the number of times that test module 200 has been inserted.

Figure 5:
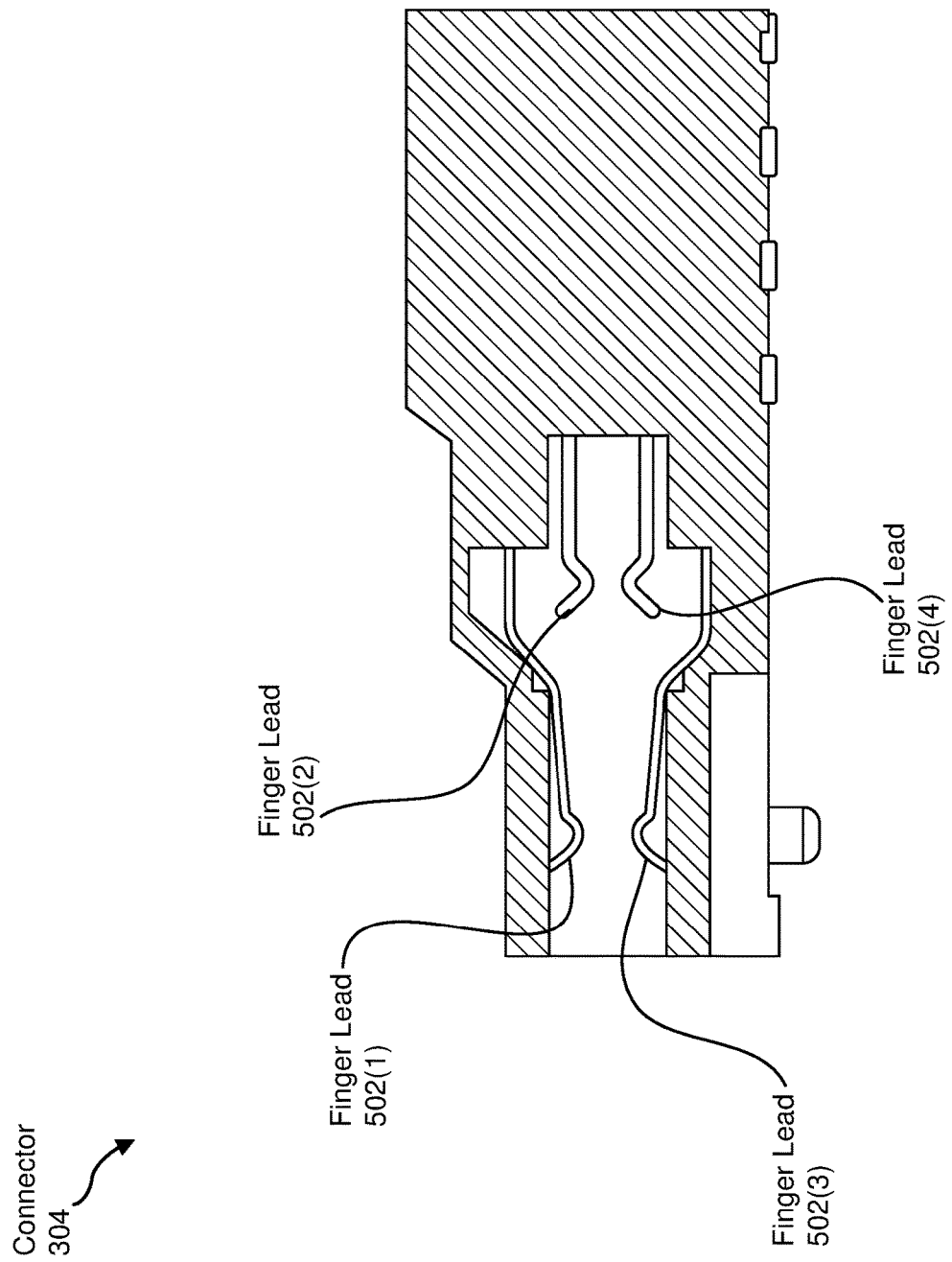
FIG. 5 is an illustration of an exemplary connector that mates and/or interfaces with modules upon insertion into a corresponding slot in accordance with one or more embodiments of this disclosure.

FIG. 5 illustrates a cross-section of an exemplary connector 304 that includes finger leads 502(1), 502(2), 502(3), and/or 502(4) for communicatively and/or electrically coupling with removable modules. In some examples, finger leads 502(1)-(4) may make physical and/or electrical contact with conductive contacts 104 of test module 200 as test module 200 is inserted into module slot 300. In one example, finger leads 502(1)-(4) may slide and/or glide across conductive contacts 104 to generate a signal indicative of insertion for test module 200.

In some examples, finger leads 502(1)-(4) may convey and/or communicate certain signals to or from test module 200 when test module 200 is installed into module slot 300. For example, finger lead 502(1) may be set to ground. Accordingly, the conductive contacts of test module 200 that come into contact with finger lead 502(1) may be pulled to ground (e.g., from high to low) during insertion of test module 200.

Figure 6:
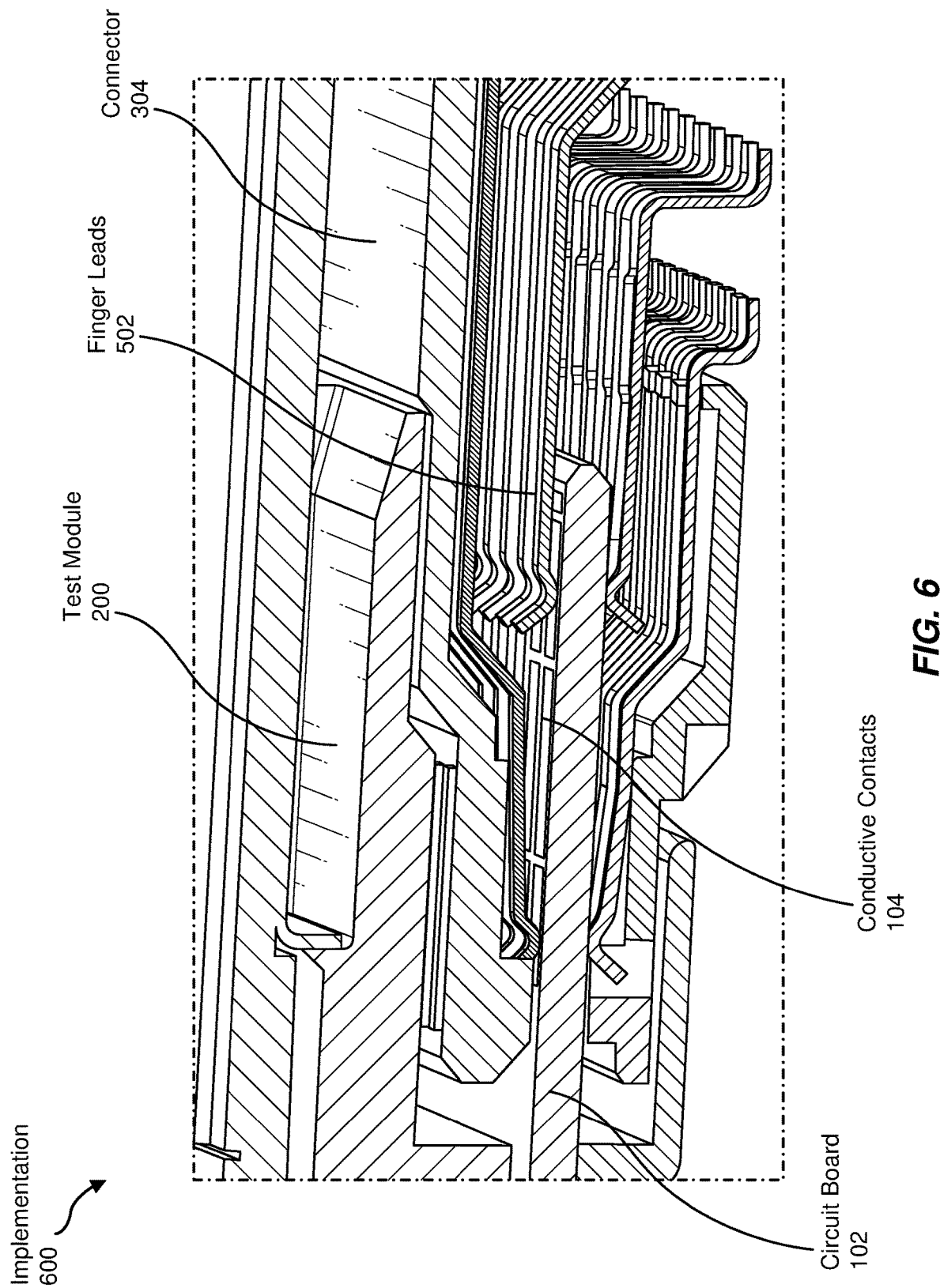
FIG. 6 is an illustration of an exemplary implementation in which conductive contacts of a test module mate and/or interface with finger leads of a connector in accordance with one or more embodiments of this disclosure.

FIG. 6 illustrates an exemplary implementation 600 of circuit board 102 being inserted between finger leads 502 (1)-(4) of connector 304 for communicatively and/or electrically coupling test module 200 and the corresponding slot. As illustrated in FIG. 6, implementation 600 may involve finger leads 502(1)-(4) making physical and/or electrical contact with conductive contacts 104 of test module 200 as test module 200 is inserted into module slot 300. In some examples, one or more of finger leads 502(1)-(4) may slide and/or glide across multiple conductive contacts each time test module 200 is inserted into and/or removed from module slot 300.

Figure 7:
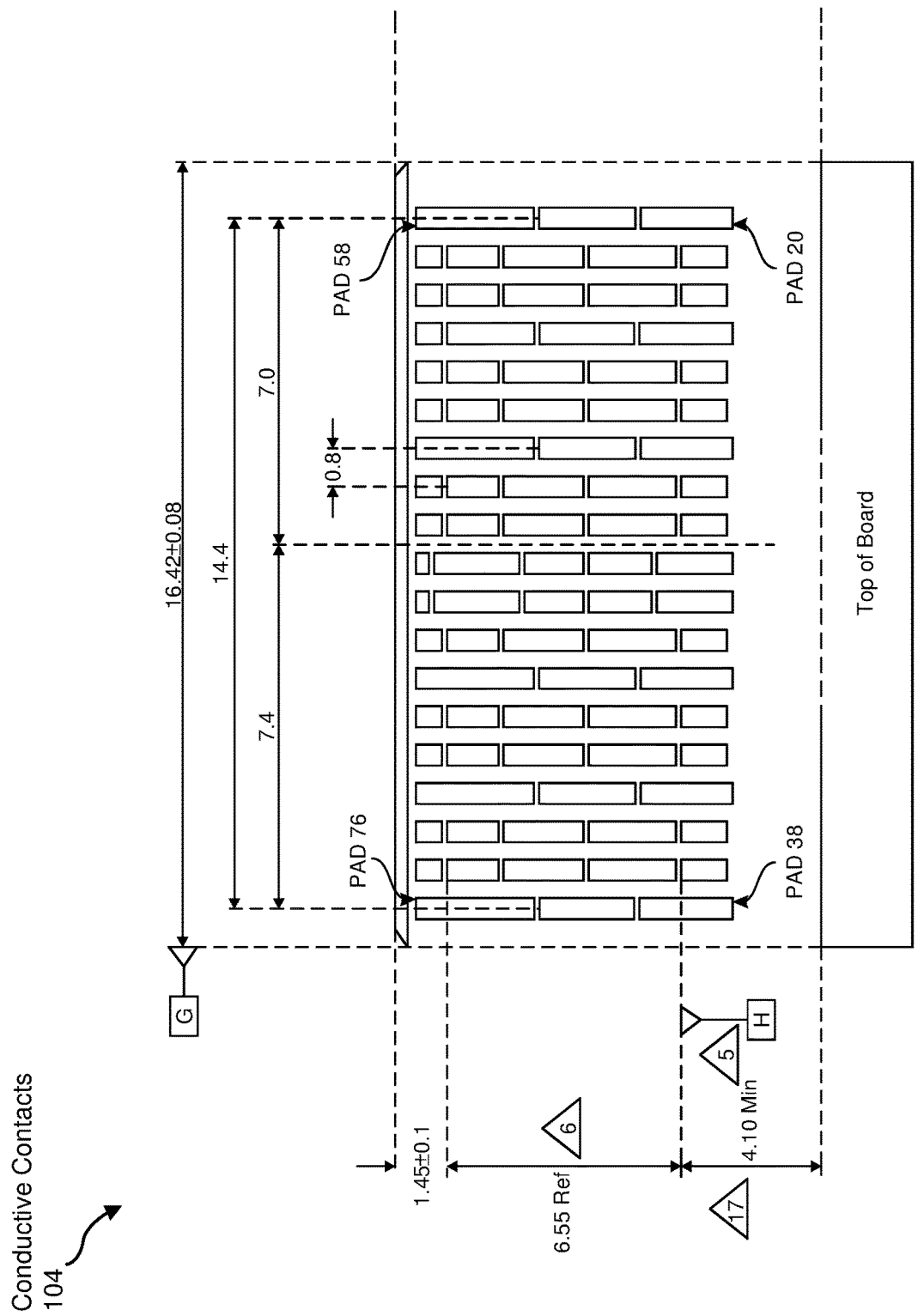
FIG. 7 is an illustration of exemplary conductive contacts disposed on a circuit board of a test module in accordance with one or more embodiments of this disclosure.
Figure 8:
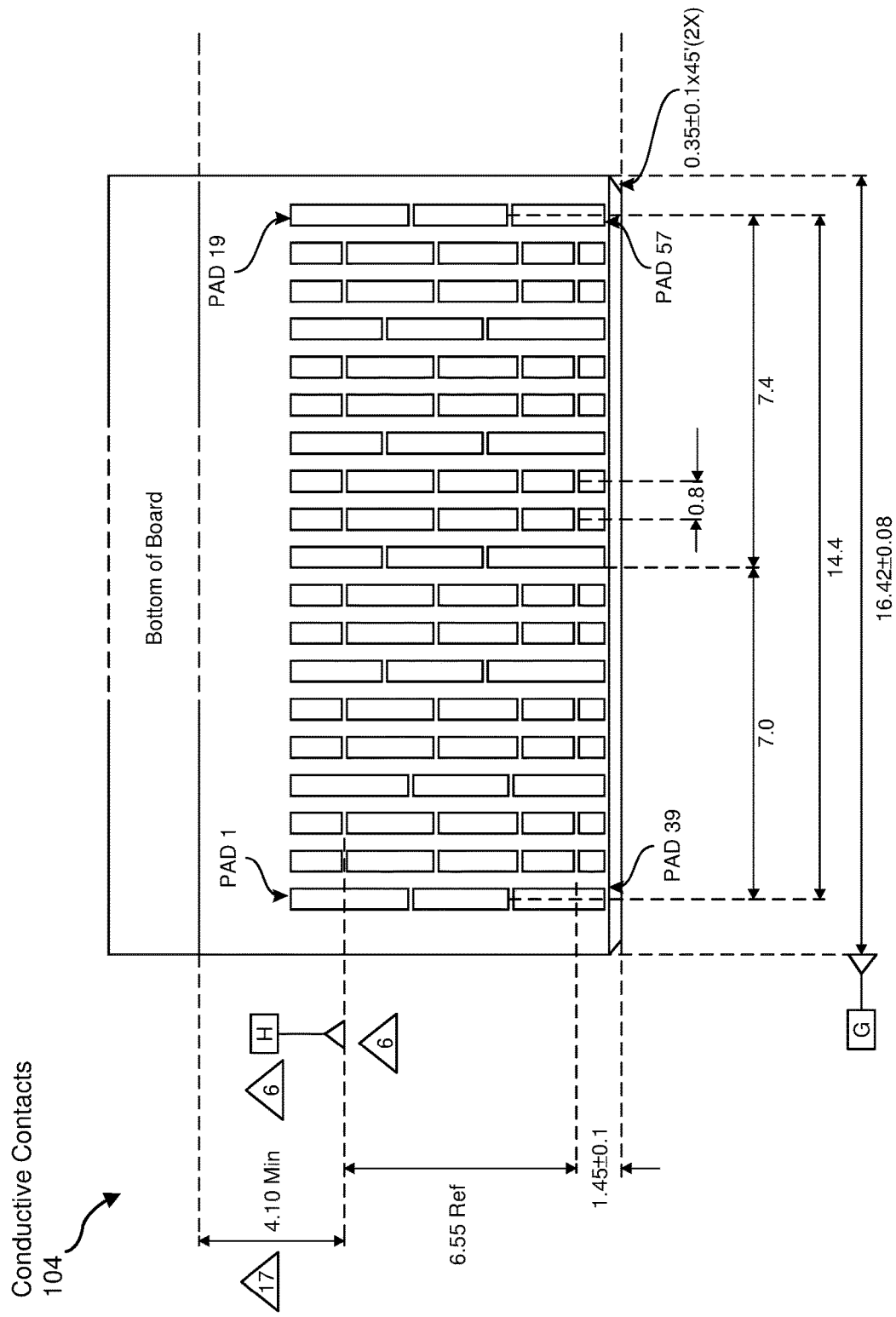
FIG. 8 is another illustration of exemplary conductive contacts disposed on a circuit board of a test module in accordance with one or more embodiments of this disclosure.

FIGS. 7 and 8 illustrate exemplary implementations of conductive contacts 104 disposed on circuit board 102. As illustrated in FIGS. 7 and 8, conductive contacts 104 may include and/or represent an array of pads. In some examples, some of these pads may be arranged linearly to make contact with certain finger leads of connector 304 as test module 200 is inserted into module slot 300. In such examples, different pads aligned in the same column may make contact with the same finger lead as test module 200 reaches different stages of insertion into module slot 300.

In one example, conductive contacts 104 in FIG. 7 may demonstrate and/or represent the implementation of pads disposed on the top of circuit board 102. Additionally or alternatively, conductive contacts 104 in FIG. 8 may demonstrate and/or represent the implementation of pads disposed on the bottom of circuit board 102.

Figure 9:
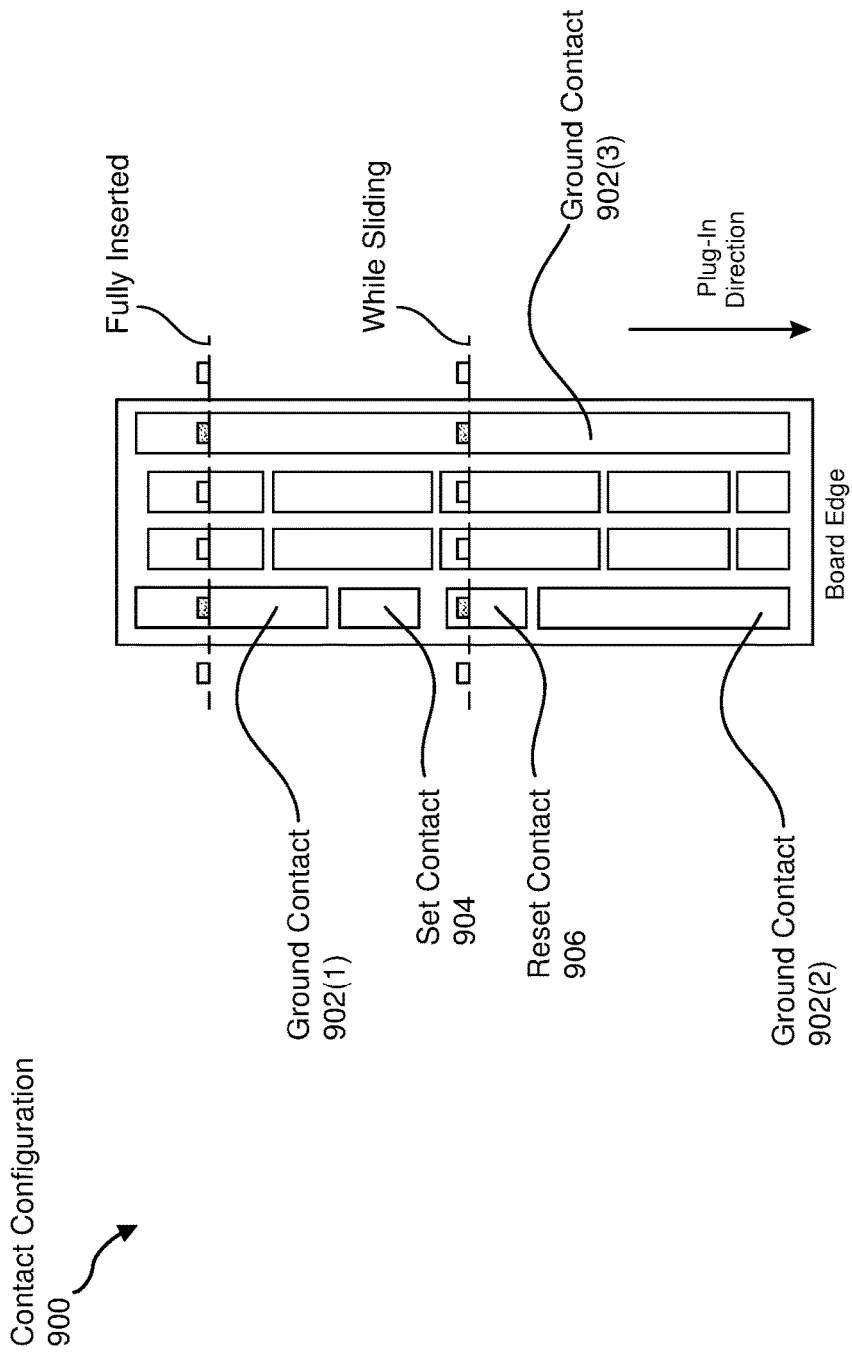
FIG. 9 is an illustration of an exemplary contact configuration disposed on a circuit board of a test module in accordance with one or more embodiments of this disclosure.

FIG. 9 illustrates an exemplary contact configuration 900 disposed on circuit board 102. As illustrated in FIG. 9, exemplary contact configuration 900 may include and/or represent 4 columns of contacts. In some examples, the left-most column in contact configuration 900 may include and/or represent a linear arrangement of ground contact 902(1), set contact 904, reset contact 906, and/or ground contact 902(2). In such examples, ground contact 902(2) may be positioned closest to the edge of circuit board 102 that is inserted between the finger leads of connector 304. In one example, the right-most column in contact configuration 900 may include and/or represent a ground contact 902(3) that spans the combined length of ground contact 902(1), set contact 904, reset contact 906, and/or ground contact 902(2).

In some examples, ground contact 902(1), set contact 904, reset contact 906, and ground contact 902(2) may each make contact with the same finger lead at different stages of insertion of test module 200. For example, at the beginning of insertion, the corresponding finger lead may first make contact with ground contact 902(2). After sliding across ground contact 902(2) during the first stage of insertion, the same finger lead may then make contact with reset contact 906. After sliding across reset contact 906 during the second stage of insertion, the same finger lead may subsequently make contact with set contact 904. After sliding across set contact 904 during the third stage of insertion, the same finger lead may finally make contact with ground contact 902(1). Upon full insertion of test module 200, the finger lead may rest and/or reside in contact with ground contact 902(1).

In some examples, ground contacts 902(1)-(3) may each be communicatively and/or electrically coupled to a ground plane and/or signal in the counter circuit 106. In one example, set contact 904 may be communicatively coupled to the set input of the signal-change detector (e.g., a flip-flop) in counter circuit 106. In this example, reset contact 906 may be communicatively coupled to the reset input of the signal-change detector in counter circuit 106.

Figure 10:
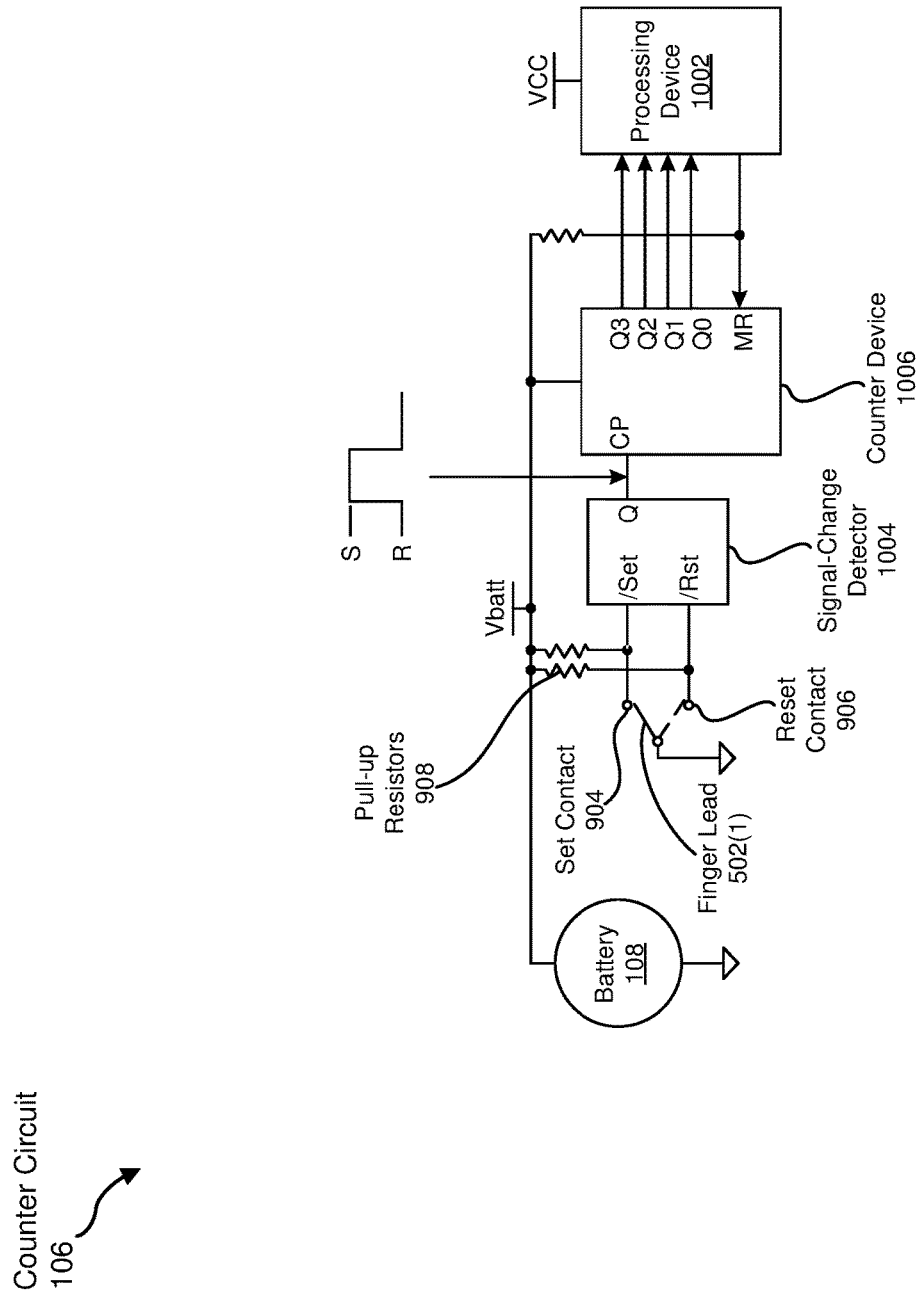
FIG. 10 is an illustration of an exemplary counter circuit disposed on a circuit board of a test module in accordance with one or more embodiments of this disclosure.

FIG. 10 illustrates an exemplary implementation of counter circuit 106 disposed on circuit board 102. As illustrated in FIG. 10, exemplary counter circuit 106 may include and/or represent a signal-change detector 1004, a counter device 1006, and battery 108. In some examples, signal-change detector 1004 may include and/or represent a set-reset flip-flop whose set input is communicatively coupled to set contact 904 and whose reset input is communicatively coupled to reset contact 906. In such examples, the output of signal-change detector 1004 may be communicatively coupled to the input of counter device 1006.

In some examples, counter device 1006 may maintain a dynamic count indicative of the number of times that test module 200 has been inserted into a suitable slot of a computing device since the occurrence of a certain event that resets the dynamic count. In one example, this event that resets the dynamic count may be the transfer of power from a suitable slot of a computing device to test module 200. Additionally or alternatively, counter device 1006 may increment the dynamic count in response to a signal change (e.g., from high to low or from low to high) on the output of signal-change detector 1004. In this example, the signal change may occur as a result of finger lead 502(1) sliding across reset contact 906 and set contact 904 within conductive contacts 104.

As illustrated in FIG. 10, battery 108 may power counter device 1006. In addition, battery 108 may effectively pull up the set and reset signals communicatively coupled to inputs on signal-change detector 1004 such that those set and reset signals remain high unless acted upon by another force. For example, pull-up resistors 908 may be electrically coupled between the power output of battery 108 and the set and reset inputs of the set-reset flip-flops. In one example, finger lead 502(1) may pull down those set and reset signals upon insertion of test module 200 into a corresponding slot. This pulldown of set and reset signals may cause the output of signal-change detector 1004 to change, thus prompting counter device 1006 to increment the dynamic count.

In some examples, a processing device 1002 may be communicatively coupled to counter device 1006 of counter circuit 106. In one example, processing device 1002 may obtain the dynamic count from counter device 1006 after insertion of test module 200 into module slot 300. In this example, processing device 1002 may draw power not from battery 108 but, rather, from module slot 300. Accordingly, processing device 1002 may draw power only from the slot into which test module 200 is inserted.

For example, processing device 1002 may obtain a dynamic count of one from counter device 1006, indicating that test module 200 has been inserted into just one slot since the last time that processing device 1002 received power from a suitable slot. As another example, processing device 1002 may obtain a dynamic count of five from counter device 1006, indicating that test module 200 has been inserted into five slots since the last time that processing device 1002 received power from a suitable slot. In this example, the dynamic count of five may result from test module 200 having been inserted without ever receiving power from the slot. The purpose of this dynamic count may be to measure and/or estimate the wear and/or degradation of the conductive edge fingers based at least in part on the number of times that test module 200 has been inserted. Accordingly, to account for all contributions to that wear and/or degradation, counter device 1006 may increment the dynamic count even if processing device 1002 does not draw power from a certain slot.

In some examples, upon obtaining the dynamic count from counter device 1006, processing device 1002 may direct counter device 1006 to reset the dynamic count. Additionally or alternatively, processing device 1002 may store a total count indicative of a total number of times that the module has been inserted into a suitable slot of a computing device in non-volatile memory. In one example, the non-volatile memory may be incorporated in processing device 1002. In another example, the non-volatile memory may be external to processing device 1002.

In one example, processing device 1002 may obtain the dynamic count from counter device 1006 after insertion of test module 200 into another slot module at a subsequent moment in time. In this example, processing device 1002 may update the total count stored in the non-volatile memory based at least in part on the dynamic count obtained from counter device 1006 at the subsequent moment in time. For example, if the total count stored in non-volatile memory indicates that test module 200 had been inserted 33 times and the newly obtained dynamic count indicates that test module 200 has been inserted only 1 time since the last update, processing device 1002 may update the total count to indicate that test module 200 has now been inserted 34 times overall.

Figure 11:
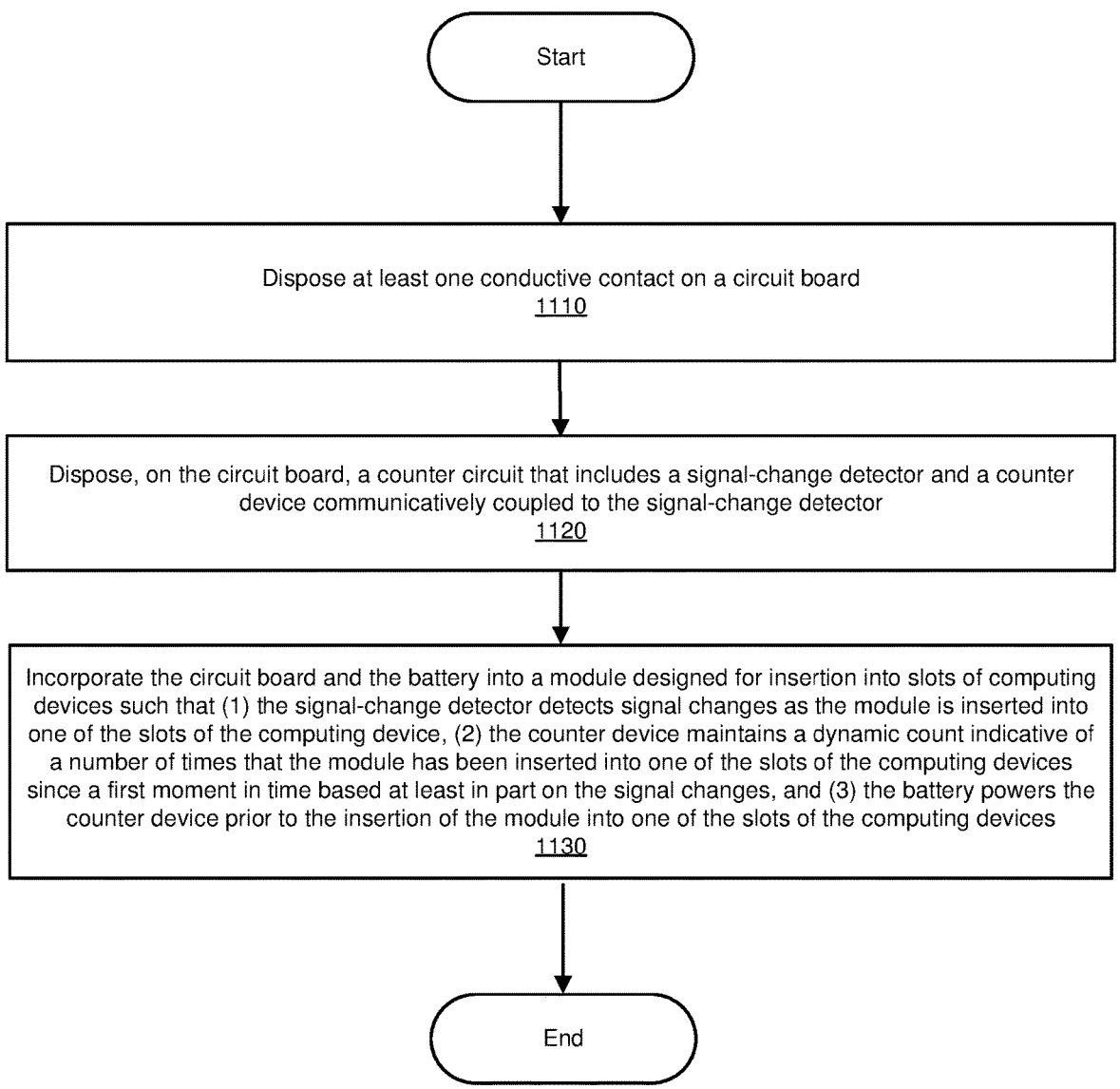
FIG. 11 is a flow diagram of an exemplary method for achieving accurate insertion counts on removable modules in accordance with one or more embodiments of this disclosure.

FIG. 11 is a flow diagram of an exemplary method 1100 for assembling and/or manufacturing a module capable of achieving and/or maintaining accurate insertion counts. Method 1100 may include the step of disposing at least one conductive contact on a circuit board (1110). Step 1110 may be performed in a variety of ways, including any of those described above in connection with FIGS. 1-10. For example, a computing equipment manufacturer or subcontractor may dispose, etch, mill, and/or plate conductive contacts 104 on circuit board 102.

Method 1100 may also include the step of disposing, on the circuit board, a counter circuit that comprises a signal-change detector and a counter device communicatively coupled to the signal-change detector (1120). Step 1120 may be performed in a variety of ways, including any of those described above in connection with FIGS. 1-10. For example, a computing equipment manufacturer or subcontractor may solder and/or conductively adhere counter circuit 106 to circuit board 102. In this example, counter circuit 106 may include and/or represent a signal-change detector and/or a counter device communicatively coupled to the signal-change detector.

Method 1100 may also include the step of incorporating the circuit board and the battery into a module designed for insertion into slots of computing devices (1130). Step 1130 may be performed in a variety of ways, including any of those described above in connection with FIGS. 1-10. For example, a computing equipment manufacturer or subcontractor may incorporate circuit board 102 and battery 108 into a module designed for insertion into slots of computing devices such that (1) the signal-change detector detects signal changes as the module is inserted into one of the slots of the computing devices, (2) the counter device maintains a dynamic count indicative of a number of times that the module has been inserted into one of the slots of the computing devices since a first moment in time (e.g., since the last reset event) based at least in part on the signal changes, and (3) the battery powers the counter device prior to the insertion of the module into one of the slots of the computing devices.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a circuit board incorporated into a module designed for insertion into slots of computing devices;
   at least one conductive contact disposed on the circuit board;
   a counter circuit disposed on the circuit board and communicatively coupled to the conductive contact, wherein the counter circuit comprises:
      a signal-change detector that detects signal changes as the module is inserted into one of the slots of the computing devices; and
      a counter device that maintains a dynamic count indicative of a number of times that the module has been inserted into one of the slots of the computing devices since a first moment in time based at least in part on the signal changes; and
   a battery electrically coupled to the counter circuit, wherein the battery powers the counter device prior to the insertion of the module into one of the slots of the computing devices.

2. The apparatus of claim 1, further comprising a processing device communicatively coupled to the counter circuit, wherein the processing device:
   obtains, from the counter device at a second moment in time, the dynamic count indicative of the number of times that the module has been inserted into one of the slots of the computing devices since the first moment in time;
   upon obtaining the dynamic count at the second moment in time, directs the counter device to reset the dynamic count; and
   stores a total count indicative of a total number of times that the module has been inserted into one of the slots of the computing devices in non-volatile memory.

3. The apparatus of claim 2, wherein the processing device:
   obtains, from the counter device at a third moment in time, the dynamic count indicative of the number of times that the module has been inserted into one of the slots of the computing devices since the second moment in time; and
   updates the total count stored in the non-volatile memory based at least in part on the dynamic count obtained from the counter device at the second moment in time.

4. The apparatus of claim 2, wherein, upon the insertion of the module into a slot of a computing device, the processing device draws power from the computing device.

5. The apparatus of claim 1, wherein:
   the conductive contact comprises a plurality of conductive contacts; and
   the signal-change detector comprises a set-reset flip-flop with a set input that is communicatively coupled to one of the conductive contacts and a reset input that is communicatively coupled to another one of the conductive contacts.

6. The apparatus of claim 5, wherein the plurality of conductive contacts are arranged linearly between a pair of ground contacts on the circuit board.

7. The apparatus of claim 6, wherein the plurality of conductive contacts are positioned to make contact with a ground pin incorporated in a slot into which the module is inserted.

8. The apparatus of claim 5, wherein the counter circuit comprises:
a first pull-up resistor that is electrically coupled between a power output of the battery and the set input of the set-reset flip-flop; and
a second pull-up resistor that is electrically coupled between the power output of the battery and the reset input of the set-reset flip-flop.

9. The apparatus of claim 5, wherein the set-reset flip-flop comprises a 4-bit flip-flop capable of recording up to 16 insertions before resetting.

10. The apparatus of claim 1, wherein the module is formatted to fit within slots designed to house optical modules in network devices.

11. A system comprising:
network devices that include slots fitted to house optical modules; and
a test module designed for insertion within the slots included on the network devices, wherein the network devices comprise:
a circuit board that includes at least one conductive contact;
a counter circuit disposed on the circuit board and communicatively coupled to the conductive contact, wherein the counter circuit comprises:
a signal-change detector that detects signal changes as the module is inserted into one of the slots of the network devices; and
a counter device that maintains a dynamic count indicative of a number of times that the module has been inserted into one of the slots of the network devices since a first moment in time based at least in part on the signal changes; and
a battery electrically coupled to the counter circuit, wherein the battery powers the counter device prior to the insertion of the module into one of the slots of the network devices.

12. The system of claim 11, wherein the test module further comprises a processing device communicatively coupled to the counter circuit, wherein the processing device:
obtains, from the counter device at a second moment in time, the dynamic count indicative of the number of times that the module has been inserted into one of the slots included on the network devices since the first moment in time;
upon obtaining the dynamic count at the second moment in time, directs the counter device to reset the dynamic count; and
stores a total count indicative of a total number of times that the module has been inserted into one of the slots of the network devices in non-volatile memory.

13. The system of claim 12, wherein the processing device:

obtains, from the counter device at a third moment in time, the dynamic count indicative of the number of times that the module has been inserted into one of the slots of the network devices since the second moment in time; and
updates the total count stored in the non-volatile memory based at least in part on the dynamic count obtained from the counter device at the second moment in time.

14. The system of claim 12, wherein, upon the insertion of the module into a slot of a network device, the processing device draws power from the network device.

15. The system of claim 11, wherein:
the conductive contact comprises a plurality of conductive contacts; and
the signal-change detector comprises a set-reset flip-flop with a set input that is communicatively coupled to one of the conductive contacts and a reset input that is communicatively coupled to another one of the conductive contacts.

16. The system of claim 15, wherein the plurality of conductive contacts are arranged linearly between a pair of ground contacts on the circuit board.

17. The system of claim 16, wherein the plurality of conductive contacts are positioned to make contact with a ground pin incorporated in a slot into which the module is inserted.

18. The system of claim 15, wherein the counter circuit comprises:
a first pull-up resistor that is electrically coupled between a power output of the battery and the set input of the set-reset flip-flop; and
a second pull-up resistor that is electrically coupled between the power output of the battery and the reset input of the set-reset flip-flop.

19. The system of claim 15, wherein the set-reset flip-flop comprises a 4-bit flip-flop capable of recording up to 16 insertions before resetting.

20. A method comprising:
disposing at least one conductive contact on a circuit board;
disposing, on the circuit board, a counter circuit that comprises:
a signal-change detector; and
a counter device communicatively coupled to the signal-change detector;
electrically coupling a battery to the counter circuit disposed on the circuit board; and
incorporating the circuit board and the battery into a module designed for insertion into slots of computing devices such that:
the signal-change detector detects signal changes as the module is inserted into one of the slots of the computing devices;
the counter device maintains a dynamic count indicative of a number of times that the module has been inserted into one of the slots of the computing devices since a first moment in time based at least in part on the signal changes; and
the battery powers the counter device prior to the insertion of the module into one of the slots of the computing devices.

* * * * *